United States Patent [19]

Crozier et al.

[11] Patent Number: 6,084,497

[45] Date of Patent: Jul. 4, 2000

[54] SUPERCONDUCTING MAGNETS

[75] Inventors: Stuart Crozier; David Michael Doddrell, both of Queensland, Australia

[73] Assignee: The University of Queensland, Queensland, Australia

[21] Appl. No.: 09/129,572

[22] Filed: Aug. 5, 1998

Related U.S. Application Data

[63] Continuation-in-part of application No. 09/129,486, Aug. 4, 1998.

[30] Foreign Application Priority Data

Aug. 5, 1997 [AU] Australia .................................. PO8413

[51] Int. Cl.[7] ........................................................ H01F 5/00
[52] U.S. Cl. ............................ 335/299; 324/319; 324/320
[58] Field of Search ..................................... 335/216, 296, 335/299, 301; 324/318, 319, 320

[56] References Cited

U.S. PATENT DOCUMENTS

| | | | |
|---|---|---|---|
| 5,410,287 | 4/1995 | Laskaris et al. ........................ | 335/216 |
| 5,428,292 | 6/1995 | Dorri et al. ............................. | 324/319 |
| 5,448,214 | 9/1995 | Laskaris ................................. | 335/301 |
| 5,565,831 | 10/1996 | Dorri et al. ........................... | 335/216 |
| 5,568,110 | 10/1996 | Dorri et al. ........................... | 335/216 |
| 5,570,073 | 10/1996 | Muller ................................... | 335/299 |

Primary Examiner—Michael L. Gellner
Assistant Examiner—Raymond Barrera
Attorney, Agent, or Firm—Mathews, Collins, Shepherd & Gould, P.A.

[57] ABSTRACT

A compact magnet is disclosed for high field, superconducting magnets for use in magnetic resonance spectroscopy. The magnet has at least a first and a second group of coils with the or each coil in the first group having wound to provide a negative current density with respect to the other coils. The first group acts to enable the overall length of the magnet to be reduced while maintaining a homogenous field over a central region of the magnet.

7 Claims, 3 Drawing Sheets

SUPERCONDUCTING MAGNETS

CROSS REFERENCE TO RELATED APPLICATION

This application is a continuation-in-part of U.S. Ser. No. 09/129,486 entitled "SUPERCONDUCTING MAGNETS", filed by the present inventors on Aug. 4, 1998.

FIELD OF THE INVENTION

This invention relates to improved designs for compact, high field, superconducting magnets for use in magnetic resonance spectroscopy and magnetic resonance microscopy or small scale imaging. In particular, the invention is directed to magnet systems that produce a homogeneous magnetic field component over a volume and where the length of the magnet system is restricted by the design configuration. Furthermore, the field outside the compact magnet is small due to shielding windings in the magnet structure.

BACKGROUND OF THE INVENTION

Magnetic resonance microscopy (MRM) is a powerful tool for probing structure and molecular dynamics on a microscopic scale. While the resolution of MRM is poor in relation to other modalities, such as electron microscopy, it has the advantage of being nondestructive and the ability to examine the dynamics of a system, and not only its inherent structure. MRM is fundamentally magnetic resonance imaging (MRI) on a smaller scale with the system redesigned to provide high resolution images. The major requirement to perform MRM over MRI is the need for a large increase in the signal-to-noise ratio (SNR). For example, in order to translate from a typical MRI isotropic resolution of 1 mm$^3$ to a MRM scale resolution of 5 $\mu$m$^3$ requires an improvement in SNR per voxel of 8×10$^6$. The SNR is not the only contributing factor to MRM resolution, however, with properties such as molecular diffusion, relaxation behavior, and sample-induced susceptibility boundary distortions affecting ultimate limits.

The method used to obtain SNR improvements is normally to decrease the size of the sample and associated hardware, namely radio frequency (rf) probes and gradient sets, and to increase the static field strength of operation. When small samples of rf coils are used, the resonant impedance of the coil usually dominates over sample impedance and the SNR is approximately proportional to $B_0^{7/4}$ where $B_0$ is the static flux density in Tesla. Herein lies the requirement of MRM to operate in strong magnetic fields, typically 7 T (300 MHz proton precessional frequency) or higher is used for modern MRM.

Operating at high field strength is also of great advantage to nuclear magnetic resonance (NMR) spectroscopists due again to the increase in SNR but also the increased chemical shift dispersion. The use of high field systems for molecular structural determination considerably predates MRM. All known MRM systems use magnets designed for molecular structure determinations, and these magnets are typically very long relative to their bore size, offering little access to the sample under study. This limited access is a distinct disadvantage in many MRM applications. NMR magnets for high field applications typically consist of a set of coaxial solenoidal coils connected with two or more external "correction" coils in the fashion described some time ago by Garrett (M. W. Garrett, J. Appl. Phys. 22, 1091 (1951); M. W. Garrett, J. Appl. Phys. 38, 2563 (1967)). These layouts have formed the basis of even the most modern coil structures (T. Kamikado et al., IEEE Trans. Magn. 30, 2214 (1994); S.-T. Wang et al., IEEE Trans. Magn. 30, 2340 (1994)). The magnet designs disclosed in these publications are typically very long relative to their bore size, (usually having a total coil length to diameter of sensitive volume ratio of 20 or so) offering little access to the sample under study. This limited access can be a distinct disadvantage in many applications. A representative layout is shown in the cross section of FIG. 1, where each of the sections contains many thousands of turns of superconducting wire. The requirements of this design are that it is "homogeneous" over a diameter-sensitive-volume (dsv), where the conductors are operating with suitable factors of safety in terms of their critical current carrying capacity and the critical field within which they reside. For simplicity, only the coil structure is detailed in this specification and not the ancillary cryogenic structures.

It is the object of this invention to provide magnet designs for high field, high resolution spectroscopy and imaging that have a reduced length over conventional designs and still produce suitably homogeneous fields over a central volume while simultaneously allowing only a small amount of field leakage external to the magnet.

BRIEF SUMMARY OF THE INVENTION

The broad form of the magnet includes two or preferably three coil groupings. The first group consists of only one internal correction coil forming an inner part of a primary section of the magnet. This correction coil has windings opposing to the majority of windings in the other coils in the primary magnet (FIGS. 2 to 4 coil(s) 10), and is designated by convention to have predominately negative current density. The second group consists of a plurality of coils on a substantially larger radius to the first group in which the majority of turns are wound such that they have a positive current density and which has a much larger total number of turns than the correction coil (FIG. 2 to FIG. 4 coils 12). The second group forms the outer part of the primary section of the magnet. The third coil grouping is wound on a larger radius to the coils of the second group, and consists of one or more coils. Where this group consists of more than one coil, most coils in this group have a negative current density—this group acts as a shielding section to reduce the stray field of the magnet (FIGS. 2 to 4 coil 14). FIG. 4 shows another embodiment of the group three coils. Group 1 coils act to enable of the overall length of the magnet to be reduced while maintaining a homogenous field over the central region. Preferably, all of the coils in any single magnet configuration are connected in series, therefore all carrying the same transport current.

DETAILED DESCRIPTION OF THE INVENTION

Figure 1:
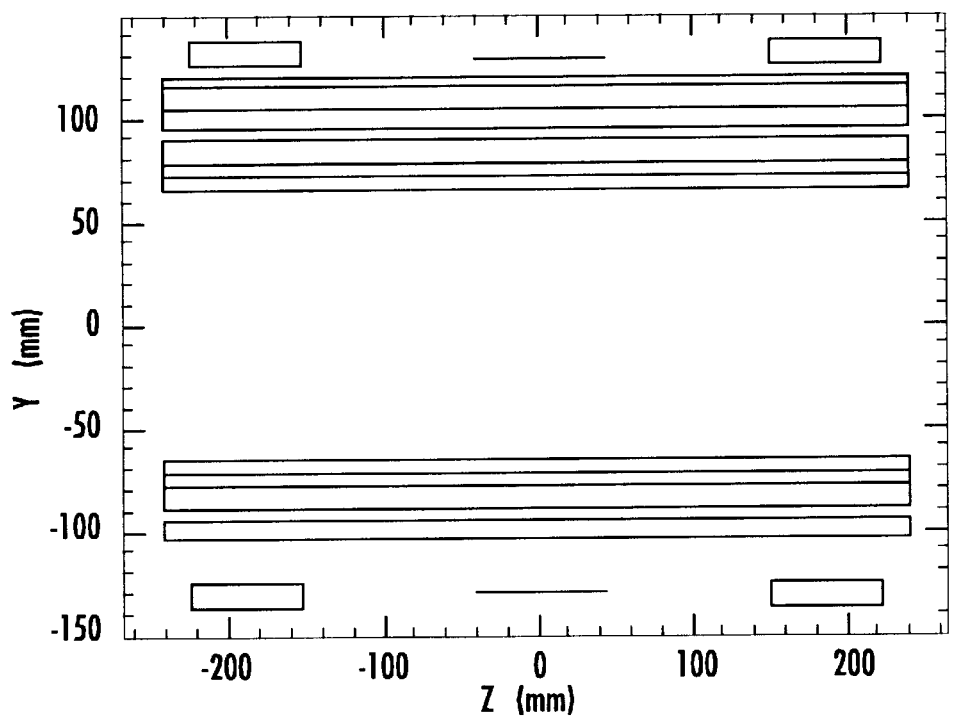
FIG. 1 shows an example of a typical high field magnet system according to prior art.

As there are a large number of design variables in such magnet system it is necessary to design an optimisation routine for these systems. A brief discussion of the methodology follows.

In Magnetic Resonance (MR), the field component of usual interest may be described by the Laplacian $$\Delta^2 B_z = 0$$

which may be expanded in spherical harmonics over a sphere of radius r in the usual way $$B_z = r^n (a_{nm} \cos m\phi + b_{nm} \sin m\phi) P_{nm}(\cos \phi)$$

where $a_{nm}$ and $b_{nm}$ are the amplitudes of the harmonics and $P_{nm}$ (cos $\phi$) are the associated Legendre polynomials are order n and degree m. In the case of systems possessing total cylindrical symmetry, as in the structures discussed here, only zonal spherical harmonics (m=o) need to be considered in the design process. In order for the magnet to be deemed homogeneous over its diameter sensitive volume (dsv), the sum of all zonal harmonics should be less than a prescribed amount of the zero order harmonic; the $B_z$ field, usually termed the $B_0$ field in NMR. The harmonic terms of interest are further restricted to even order zonal terms as the current density distribution in these magnets is even and axisymmetric. For a theoretical design the homogeneity requirements should be less than 5 parts per million.

A bare magnet homogeneity requirement of 20 ppm or less over the dsv is common for MRI systems.

It is also important that the spatial distribution of the field inhomogeneity in the field be characterized by low order terms after construction, so that they may be removed by passive or active (superconducting) shimming, a process where the purity of the field is improved using additional (shim) coils. The theoretical design process, therefore, must place special emphasis on reducing the higher order terms. The problem then, is to generate a coil structure to satisfy the harmonic purity requirements while restricting the total length of the magnet. In addition it must be specified to reduce the field outside the magnet.

The Simulated Annealing method (SA) (S. Kirkpatrick, D. C. Gelatt and M. P. Vechhi, *Science* 220, 671 (1983)) is an effective large scale optimization method and may be applied to high field magnet design. By imposing length constraints, the SA routine effectively attempts to find the "best" solution possible within these limits. Here "best" refers to the minimization of an error function which, in this case, contains terms representing the homogeneity of the diameter sensitive volume and the stray field outside the magnet. It is possible to include other terms in the function as the designer requires. The error function for the designs presented here was simply:

$$E = k_a \sum_{n=1}^{9} k_n A_{2n} + k_b \left( \sum_{m=1}^{l} B_{mod}(z_m) + \sum_{m=1}^{l} B_{mod}(y_m) \right)$$

where $k_a$ and $k_b$ are the weighting factors for the homogeneity and shielding terms respectively, $k_n$ are the weighting factors for the zonal harmonics and $A_{Zn}$ are the amplitudes of the even order zonal harmonics of $B_z$. The two summations of the shielding terms are the modulus field additions longitudinally and vertically at the chosen shielding distances respectively and for each iteration ten points per direction were summed (ie. I=10).

The homogeneity term is the most difficult to minimize and so may be weighted 5:1 when compared to the shielding term. Even order zonal harmonics may be weighted 1:10:100:1000:5000:8000:10000:12000:15000 up to $18^{th}$ order.

The parameters for perturbation in the design process for each iteration were; the axial and radial dimensions of each coil, the number of turn per coil and the radial and axial position of each coil. In order to introduce sufficient degrees of freedom in these constrained problems, the design began with relatively large numbers of coils (ten) and allow the SA process to redistribute them. Adaptive step sizing (A Corona, M. Marchesi, C. Martini and S. Ridella, *ACM Trans. Math. Soft.* 13, 262 (1987)) was implemented and initial step sizes and temperatures selected by testing each coil for parametric sensitivity prior to the SA run.

TABLE 1

Compact Shielded Magnet Homogeneity

| | | |
|---|---|---|
| Transport current for 7.05T (Amps) | 427.5 | |
| Length of conductor (km) | 17.12 | |
| Homogeneity (35 mm dsv) (ppm) | | |
| peak-to-peak | 0.6 | |
| Rms | 0.3 | |
| Shielding (axial 5 g contour) | 1.7 | m |
| Shielding (radial 5 g contour) | 2.0 | m |
| Field Harmonics (ppm) | | |
| Z2 | 5.1e−3 | |
| Z4 | 4.1e−2 | |
| Z6 | −3.9e−1 | |
| Z8 | −1.1e−1 | |
| Z10 | −1.1e−3 | |
| Z12 | 1.8e−4 | |
| Z14 | −1.3e−6 | |
| Z16 | −3.2e−8 | |
| Z18 | 3.3e−8 | |

Figure 2:
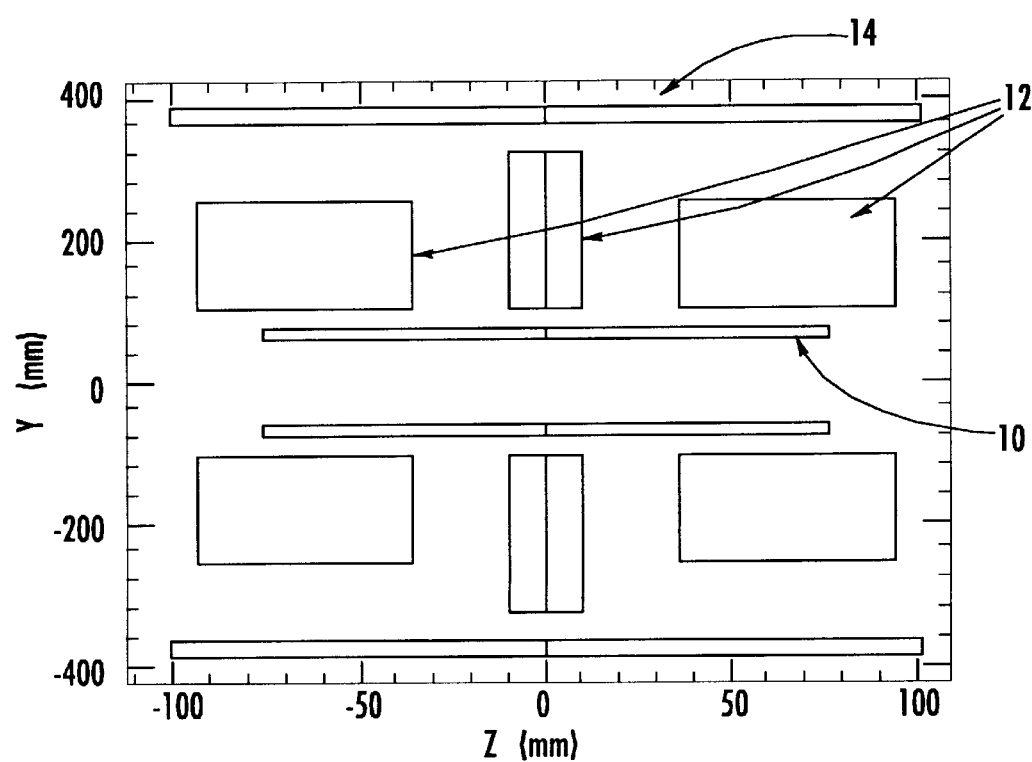
FIG. 2 shows an examplary embodiment of a magnet coil configuration having one coil 10 in a first group, three coils 12 in a second group and one coil 14 in a third group.
Figures 3, 4:
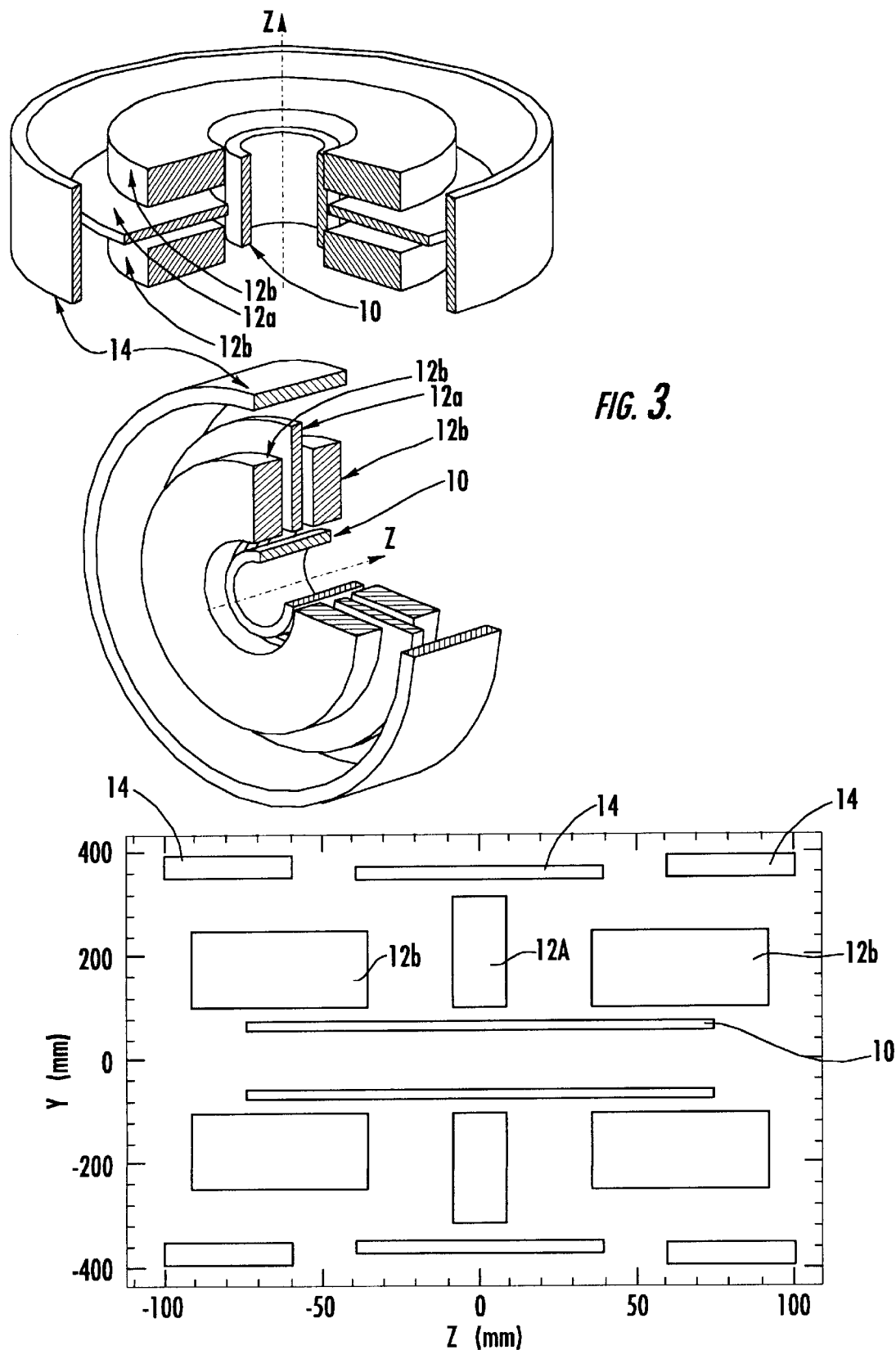
FIG. 3 shows a cut-away perspective view of the embodiment of FIG. 2.
FIG. 4 shows an examplary embodiment of a magnet coil configuration like that shown in FIG. 2 except that the third group of coils 14 consists of three coils.

In an exemplary embodiment, the process was used to design a 7 Tesla magnet system with an inner coil radius restricted to 55 mm so that the free bore diameter may approximate 89 mm (a standard commercial figure). The invention is not limited to the precise form or dimensions disclosed in this example. FIG. 2 shows the schematic of the resultant compact design in cross-section. FIG. 3 shows a perspective view of the optimized structure, the bore of the resultant design may be oriented in either a vertical or horizontal sense as shown in this figure. In a further embodiment of the invention, all coils are arranged to have elliptical cross-sectional areas rather than the circular cross-sections indicated in the figures.

The performance of the magnet is detailed in Table 1 and indicates the high homogeneity and small fringe fields of the magnet. The total length of the magnet coils in the z axial direction is 200 mm giving a coil length to homogenous region diameter ratio of 5.7, indicating the compactness of the system. The harmonics of the field were calculated to $18^{th}$ order and the peak-to-peak and rms field deviations were calculated over 800 points on the surface of the dsv in 20 planes, the distribution of these planes being chosen to be the zeros of the $20^{th}$ order Legendre polynomial so that Gaussian integration may be readily implemented, and to ensure that Nyquist sampling requirements were met for $18^{th}$ order harmonic analyses. Note that the homogeneity figures are bare homogeneity values, that is, that no additional superconducting or room temperature coils were added to further improve the field purity.

Figure 5:
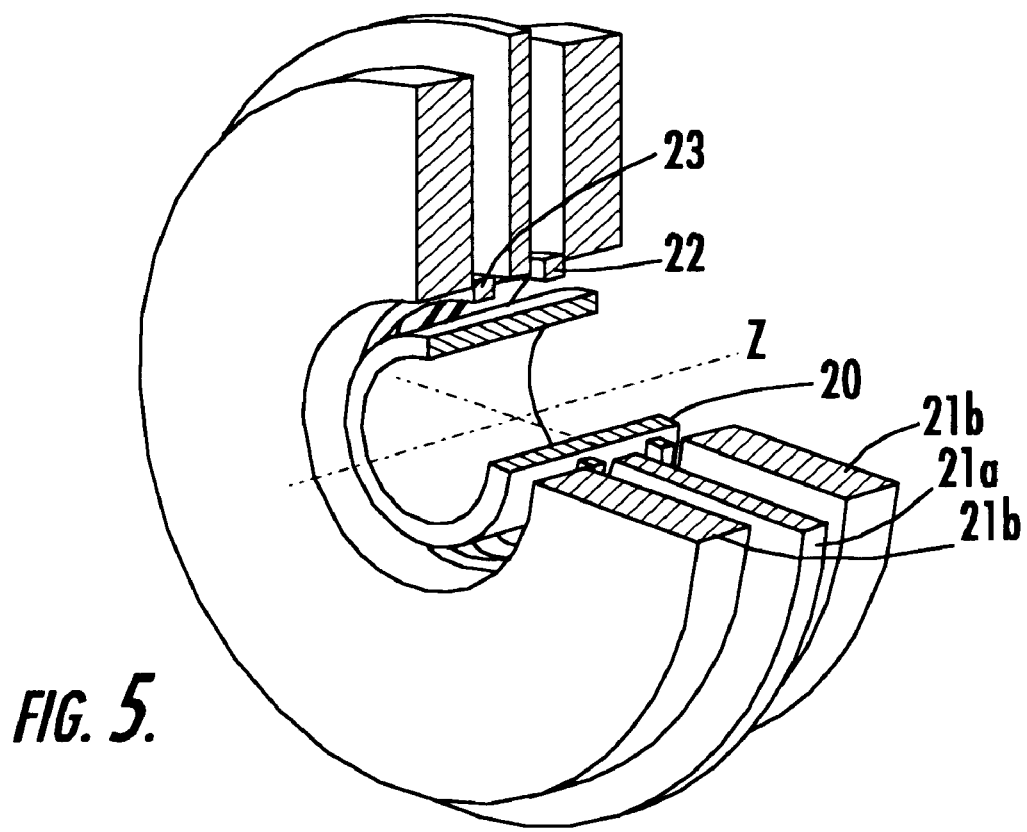
FIG. 5 shows a further examplary embodiment of a magnet coil configuration.

FIG. 5 shows a cut away view of a complete magnet coil configuration. In this embodiment the shielding section 14 in the previously described embodiment has been omitted. Coil 20 is counter wound to the winding direction adopted for coils 21a, 21b. Additional coils 22 and 23 are shown present between adjacent coils 21. Table 3 gives performance characteristics for the magnet coil of FIG. 5.

TABLE 3

| Transport current for 7.05T (A) | 390 |
| --- | --- |
| Length of conductor (km) | 10.0 |
| Homogeneity (40 mm dsv) (ppm) | |
| peak-to-peak | 0.74 |
| Rms | 0.4 |
| Field harmonics (ppm) | |
| Z2 | 4.1e−2 |
| Z4 | −2.0e−2 |
| Z6 | 2.0e−1 |
| Z8 | −4.4e−1 |
| Z10 | 2.0e−3 |
| Z12 | 8.7e−4 |
| Z14 | −1.4e−5 |
| Z16 | −1.8e−8 |
| Z18 | 3.1e−7 |

Table 4 provides details of magnet coil layouts where $t_d$ is the turns density in each coil of the embodiment of FIG. 5.

TABLE 4

| Coil No. | Left end (mm) | Right end (mm) | Number of turns | Inner radius (mm) | Outer radius (mm) | $t_d(mm)^{-2}$ |
| --- | --- | --- | --- | --- | --- | --- |
| 21a | 0 | 9.0 | 733 | 100.089 | 283.523 | 0.444 |
| 22 | 28.7 | 40.7 | 67 | 92.705 | 105.280 | 0.444 |
| 21b | 40.7 | 88.7 | 3399 | 97.887 | 257.374 | 0.444 |
| 20 | 0.0 | 73.5 | −619 | 54.835 | 73.803 | 0.444 |

The harmonics of the filed were calculated to $18^{th}$ order and the peak-to-peak and rms field deviations were calculated over 800 points on the surface of the dsv in 20 planes, the distribution of these planes being chosen to be the zeros of $20^{th}$ order Legendre polynominal so that Gaussian integration may be readily implemented, and to ensure that Nyquist sampling requirements were met for $18^{th}$ order harmonic analyses. We have verified the accuracy of our field and harmonic calculations by the comparison with commercial electromagnetics software (Vector Fields, Oxford); the results were within 0.01% of each other. Note that the homogeneity figures are bare homogeneity values, that is, that no additional superconducting or room temperature coils were added to further improve the field purity. With the addition of such shims, the magnet described in Tables 3 and 4 would be appropriate for chemical applications as well as MRM.

An important consideration in superconducting magnets is to ensure that the conductors are operating within acceptable limits of current density and submersed field strengths. The maximum field in any conductor was calculated to be 12.1 T. Using a $Nb_3Sn$ conductor, with a turn density of 0.444 mm$^{-2}$ (see Table 4) and a superconductor-to-matrix filling ratio is approximately 0.6—quite a reasonable operating safety margin. While $Nb_3Sn$ is a more expensive conductor than NbTi, its ability to carry higher current density, and the compact design mean that a relatively small amount of conductor is needed when compared to conventional designs.

Table 2 provides details of magnet coil layouts where $t_d$ is the turns density in each coil of the embodiment of FIGS. 2 and 3.

TABLE 2

| Magnet Coil layouts | | | | | |
| --- | --- | --- | --- | --- | --- |
| Coil | Zed (mm) | Width (mm) | # Turns | Inner radius (mm) | $t_d$ (mm)$^{-2}$ |
| 12a | 4.5 | 9.0 | 870 | 100.566 | 0.444 |
| 12b | 63.98 | 57.0 | 3852 | 98.281 | 0.444 |
| 10 | 37.5 | 75.0 | −641 | 54.884 | 0.444 |
| 14 | 50.25 | 100.5 | −1281 | 350.065 | 0.444 | where "Zed" indicates the longitudinal position of the middle of each coil, "Width" indicates the axial extent of each coil and $t_d$ is the turns density.

What is claimed:

1. A magnet for use in magnetic resonance spectroscopy, comprising a magnet extending along a z axis and a y axis, the magnet having a primary section with only one first coil forming an inner part of the primary section of the magnet and at least one group of second coils having a larger radius than the first coil, the second coils are located on and extending along a first line parallel to the z axis for a first predetermined distance and are spaced from one another along that line, the coils being wound so that the first coil has a current density opposite that of the said group of second coils which has a larger number of ampere turns than the ampere turns of the first coil and the first coil extending along a second line parallel to the z axis for a distance greater than 50% of the first predetermined distance.

2. The magnet as claimed in claim 1 in which said first coil is an internal correction coil.

3. The magnet as claimed in claim 1 including at least one third coil wound on a larger radius than the said first and second coils, which acts as a shielding section for reducing stray fields, the said at least one third coil being wound so as to have a current density opposite that of said second coils.

4. The magnet as claimed in claim 1 wherein the coils of a group thereof are connected in series.

5. The magnet as claimed in claim 1 having a magnetic field strength of 7 Tesla and in which the radius of the inner most coil is 55 mm with a free bore diameter of 89 mm.

6. The magnet as claimed in claim 1 wherein the said group of second coils comprises three said second coils.

7. The magnet as claimed in claim 1 wherein all said coils have an elliptical cross section.

* * * * *